(12) United States Patent
Weber et al.

(10) Patent No.: US 10,669,039 B2
(45) Date of Patent: Jun. 2, 2020

(54) SEGMENTED LIGHTNING DIVERTER ELEMENT HAVING INTEGRATED ESD PROTECTION

(71) Applicant: AIRBUS OPERATIONS GMBH, Hamburg (DE)

(72) Inventors: Lutz Weber, Hamburg (DE); Michael Kaste, Hamburg (DE); Robert Kebel, Hamburg (DE); Detlef Ristau, Hamburg (DE)

(73) Assignee: Airbus Operations GmbH, Hamburg (DE)

(*) Notice: Subject to any disclaimer, the term of this patent is extended or adjusted under 35 U.S.C. 154(b) by 324 days.

(21) Appl. No.: 15/679,695

(22) Filed: Aug. 17, 2017

(65) Prior Publication Data
US 2018/0050818 A1   Feb. 22, 2018

(30) Foreign Application Priority Data

Aug. 18, 2016  (DE) .................. 10 2016 215 459

(51) Int. Cl.
| | |
|---|---|
| H05F 3/00 | (2006.01) |
| B64D 45/02 | (2006.01) |
| H02G 13/00 | (2006.01) |
| H01Q 1/00 | (2006.01) |
| H01Q 1/42 | (2006.01) |
| H01Q 1/28 | (2006.01) |
| H05K 9/00 | (2006.01) |

(52) U.S. Cl.
CPC ............ *B64D 45/02* (2013.01); *H01Q 1/002* (2013.01); *H01Q 1/281* (2013.01); *H01Q 1/42* (2013.01); *H02G 13/40* (2013.01); *H05K 9/0067* (2013.01); *H05K 9/0079* (2013.01)

(58) Field of Classification Search
None
See application file for complete search history.

(56) References Cited

U.S. PATENT DOCUMENTS

| | | | |
|---|---|---|---|
| 3,416,027 A | 12/1968 | Amason et al. | |
| 4,262,321 A * | 4/1981 | Cline | B64D 45/02 361/218 |

(Continued)

FOREIGN PATENT DOCUMENTS

| | | |
|---|---|---|
| DE | 102008035917 A1 | 2/2010 |
| FR | 2913504 A1 | 9/2008 |

(Continued)

OTHER PUBLICATIONS

German Search Report for Application No. 102016215459 dated Apr. 11, 2017.

*Primary Examiner* — Stephen W Jackson
(74) *Attorney, Agent, or Firm* — Jenkins, Wilson, Taylor & Hunt, P.A.

(57) ABSTRACT

A lightning diverter element having integrated ESD protection, including a support and metallic segments disposed on the support is disclosed, wherein the support has a resistance per unit length in a range from 100 kΩ/m to 100 MΩ/m. Furthermore, a high-frequency device is disclosed, wherein such a lightning diverter element is disposed on a surface of a component of the high-frequency device. Finally, a vehicle including such a lightning diverter element and/or such a high-frequency device is disclosed.

13 Claims, 3 Drawing Sheets

(56) References Cited

U.S. PATENT DOCUMENTS

| | | | |
|---|---|---|---|
| 4,506,311 A | 3/1985 | Cline | |
| 4,796,153 A | 1/1989 | Amason et al. | |
| 5,841,066 A | 11/1998 | Bocherens | |
| 7,765,864 B2 | 8/2010 | Bernus | |
| 8,699,203 B2 | 4/2014 | Le Louarn et al. | |
| 2008/0270052 A1 | 10/2008 | Bernus | |
| 2011/0141645 A1 | 6/2011 | Le Louarn et al. | |

FOREIGN PATENT DOCUMENTS

| | | |
|---|---|---|
| WO | WO 2009/153452 A2 | 12/2009 |
| WO | WO 2010/012765 A1 | 2/2010 |

\* cited by examiner

SEGMENTED LIGHTNING DIVERTER ELEMENT HAVING INTEGRATED ESD PROTECTION

CROSS-REFERENCE TO RELATED APPLICATION

This application claims priority to German Patent Application DE 10 2016 215 459.1 filed Aug. 18, 2016, the entire disclosure of which is incorporated by reference herein.

TECHNICAL FIELD

The present disclosure relates, in general, to protection against electrostatic discharges (English: electrostatic discharge, ESD).

BACKGROUND

The present disclosure relates to, among other things, a lightning diverter element (lightning diverter strip) comprising a support and metallic elements disposed on the support. Furthermore, the disclosure relates to a high-frequency device, wherein at least one such lightning diverter element is disposed on a surface of a component of the high-frequency device. Finally, the disclosure relates to a vehicle comprising such a lightning diverter element and/or such a high-frequency device.

Electrical shocks, for example electrostatic discharges or lightning strikes, can cause personal injury and property damage. In order to prevent this, electrotechnical protection measures are necessary. For example, measures for protection of vehicles, for example aircraft, their passengers, and devices disposed in them, for example high-frequency devices such as radar devices, are often required. For this reason, there are lightning diverter elements that divert the lightning current in that they pass it on to a metallic structure, and thereby preserve a component to be protected from the harmful effects of a lightning strike.

US 2008/0270052 A1 and FR 2 913 504 A1 each disclose an arrangement in which one or more electrically conductive lightning diverter elements, which are connected with an electrically conductive structure, are affixed on the outside of an electrically insulating structure. At least one sensor is made available close to the inside of the electrically insulating structure, which sensor delivers a signal if a lightning current flows through a lightning diverter element.

DE 10 2008 035 917 A1 and WO 2010/012765 A1 each disclose an arrangement for lightning protection of radomes and transmission/reception apparatuses, having a protective sheath that is permeable to electromagnetic radiation. Diverter elements, which are connected with a metallic structure on one side, in each instance, for diverting lightning currents, are disposed on the protective sheath. The diverter elements can be either solid metallic diverter elements or segmented diverter elements.

Additional protection against the effects of electrostatic discharges is appropriate in the interests of functional reliability and prevention of damage.

SUMMARY

According to a first aspect of the present disclosure, a lightning diverter element comprising a support and metallic segments disposed on the support is disclosed, wherein the support has a resistance per unit length in a range from 100 kΩ/m to 100 MΩ/m.

According to a second aspect, a high-frequency device is disclosed, wherein at least one segmented lightning diverter element according to the first aspect is disposed on a surface of a component of the high-frequency device.

According to a third aspect, a vehicle comprising a segmented lightning diverter element according to the first aspect and/or a high-frequency device according to the second aspect is disclosed.

In the context of the present disclosure, a vehicle can be, for example, an aircraft, for example an airplane; a land vehicle, for example a motor vehicle or rail vehicle; or a watercraft, for example a ship. The vehicle can be set up for transport of passengers.

In the following, the present disclosure will be described with primary focus on the first aspect, for reasons of clarity, with the following explanations applying analogously for the second and third aspect.

Because of the fact that the support of the lighting diverter element according to the first aspect has a resistance per unit length in a range from (including) 100 kΩ/m to (including) 100 MΩ/m, a certain electrical conductivity of the support exists. Thus a slight current flow is permanently made possible between the metallic segments disposed on the support. Static charge that collects because of the triboelectric effect, for example when using the fuselage of an aircraft, due to friction with the hydrometeors or aerosols in general, can therefore flow away by way of the support. In this way, it is prevented that one of the metallic segments, on which electrical charge has collected due to the triboelectric effect, is discharged by way of the other metallic segments, and spark formation is avoided. Such discharges can lead to a permanently applied high voltage at one of the components to be protected and can therefore damage this component. For example, a voltage on the order of several 100 V can be applied to an antenna, for example an antenna of an aircraft, due to the triboelectric effect, so that a corresponding voltage can be applied at connected components, particularly high-frequency components. However, these are often designed only for input voltages of a few µV, and can be damaged if a clearly higher voltage is applied to them over an extended period of time.

The resistance per unit length in the range from 100 kΩ/m to 100 MΩ/m of the lightning diverter element is selected in such a manner that flow of a lightning current by way of the support is prevented, while at the same time, controlled electrostatic discharge is guaranteed. A lightning diverter according to the first aspect can therefore implement both lightning protection and protection against the effects of the triboelectric effect. In aeronautics, for example, it is desirable to guarantee protection against the effects of the triboelectric effect. The conductivity of the support, even if it is not very marked, can furthermore make it possible that a charge on a surface of a component composed of electrically insulating material, for example a glass fiber composite material, on which the lightning diverter element with its support is disposed, can flow away by way of the support to a certain extent, for example to a metallic structure such as an aircraft fuselage, for example. Additional measures to allow a static charge to flow away from the surface, for example varnishing with an anti-static varnish, can be unnecessary or at least required to a lesser extent.

In the case of a segmented lightning diverter element having an insulating support, controlled discharge of an electrical charge that collects due to the triboelectric effect is hardly possible.

One end of the lightning diverter element according to the first aspect of the present disclosure can be free and can be connected with or is connected with a metallic structure, to which the lightning current is discharged. The metallic segments can form preferred impact points for lightning. A stroke of lightning can be discharged to the metallic structure, at least with regard to its major portion, by way of an ionized channel that forms above the segments of the lightning diverter element. At the same time, the lightning diverter element can shield a component to be protected and thereby prevent lightning discharge to it, or can at least lower the current intensity significantly. Because of the presence of the metallic segments, the lightning diverter element according to the first aspect of the present disclosure can also be referred to as a segmented lightning diverter element. The lightning diverter element can be configured in strip shape, for example, i.e. it can be present as a lightning diverter strip. The lightning diverter element can be configured to be mechanically flexible. The metallic segments of the lightning diverter element can be disposed on the support so as to be uniformly spaced apart from one another. The lightning diverter element can be set up for use on the surface of a vehicle, for example of an aircraft, and this includes the case of installation on an antenna disposed on the surface of an aircraft, for example. The further possible areas of use of a lightning diverter element according to the first aspect include, among others, use on rotor blades of wind power plants.

According to one variant, the support is structured to be monolithic. This can be implemented, for example, in that a support composed of a single layer is selected. As compared with a support having multiple layers, for example two layers, one of which is electrically insulating and the other of which has a certain electrical conductivity and connects the metallic systems to allow static charge to flow away, for example, such a monolithic structure can be produced more easily and more cost-effectively, among other things, because of its lesser complexity.

Different support geometries are possible. For example, the support can have a square or rectangular cross-section. For example, the thickness of the support can lie in the range from 0.5 mm to 1 mm, especially in the range from 0.8 to 1.2 mm, and can amount to 1 mm, for example. The width of the support can lie in the range of the segment width, for example, up to 20 mm. In general, it can be stated that the geometry of the support does not have any significant influence on making controlled electrostatic discharge possible.

According to one variant, the basic material of the support is doped with an electrically conductive doping material. A desired resistance per unit length of the support can be achieved with comparatively great precision by doping with an electrically conductive doping material. Possible examples of electrically conductive doping materials to be mentioned here are graphite, aluminum, for example present as aluminum powder, and glass beads having a metallized surface. The basic material of the support can be an insulating material. For example, the basic material can be a plastic, for example a silicone.

According to one variant, the doping material makes up 3 to 5 volume percent, especially 3.5 to 4.5 volume percent, for example approximately 4 volume percent, of the material of the support. Depending on the basic material and the support geometry, a resistance per unit length in the value range from 100 kΩ/m to 100 MΩ/m can be implemented in this way.

According to one variant, the resistance per unit length lies in a range from 1 MΩ/m to 100 MΩ/m.

According to one variant, the volume resistance of the support is homogeneous. For example, the volume resistance of the support can be homogeneous in at least one section of the support. In particular, the volume resistance can be homogeneous over the entire support. The term homogeneity of the volume resistance includes deviations of the volume resistance value within usual tolerances. This can guarantee that flow of a lightning current by way of the support is prevented. This could not be guaranteed, for example, in the case of a support in which one or more conductors, for example copper wires, run through a support that otherwise comprises or consists of insulating material. Here, the lightning could strike the conductors and the lightning current could then be transported by them.

The geometry of the metallic segments can be selected in any desired manner. According to one variant, the shape of at least one, several or all of the metallic segments is selected from among the following shapes: round, square, rectangular, triangular. In particular, all the segments can have the same shape. However, segments having different shapes, mixed, can also occur.

In the case of a high-frequency device according to the second aspect of the present disclosure, the lightning diverter element can ensure lightning protection and protection against the effects of the triboelectric effect on the surface of the component of the high-frequency device. The protection can extend to cover not only the component itself but also components of the high-frequency device that are connected with it or covered by it, if applicable.

According to one variant, the high-frequency device comprises at least one of the following components: an antenna, a transmission unit, a receiving unit, a connection means. The connection means can be, for example, a cable, for example a coaxial cable, a plug, etc. The antenna can be a blade antenna or a low-drag antenna, for example. Each component can be present singly or multiple times. The protection against the effects of the triboelectric effect that can be implemented by the lightning diverter element according to the first aspect of the present disclosure, at the surface of the lightning diverter element, can, for example in the case of a high-frequency device comprising an antenna, prevent that because of a high voltage caused in the antenna due to the triboelectric effect, a corresponding high voltage is applied to one or more components of the high-frequency device, for example a transmission unit, connected with the antenna, by way of corresponding connection means, and damages or destroys these components.

According to a variant, the high-frequency device comprises a sheath that is penetrable for electromagnetic radiation, on the surface of which a lightning diverter element according to the first aspect of the present disclosure is disposed. In this variant, the sheath can become statically charged because of the circumstance that it is penetrable for electromagnetic radiation, i.e. has dielectric properties. For example, the sheath can comprise or consist of a glass fiber composite material. Because of its low electrical conductivity, the support of the lightning diverter element can allow the charge to flow from the sheath to a structure with which the support is connected at one end. Taking additional measures in order to allow static charge to flow away from the sheath, for example applying an anti-static varnish, can be unnecessary. According to one variant, the sheath is therefore free of an anti-static varnish.

According to one variant, the high-frequency device is a radar device, for example a radar device that is set up for use in an aircraft, for example an airplane. Within this variant, the sheath that is penetrable for electromagnetic radiation can be a radome. The protection against the effects of the triboelectric effect at the surface of the lightning diverter element, which can be implemented by a lightning diverter element according to the first aspect of the present disclosure, can make it possible, for example, that in the case of a radar device for use in an aircraft, protection against the effects of the triboelectric effect is possible.

According to one variant, the high-frequency device comprises an antenna that possesses a surface on which the lightning diverter element is disposed. The antenna can have a metallic basic body. The surface of the antenna can have a lesser electrical conductivity than the basic body. For example, the surface of the antenna can be electrically non-conductive or only weakly conductive electrically. The antenna can be a low-drag antenna, for example. An antenna can represent a preferred impact point for lightning strikes— even in the case of only weak or absent electrical conductivity of its surface. This can hold true all the more if the antenna is affixed in an exposed location and/or not covered. An example of this is placement of the antenna on the fuselage of an aircraft, for example an airplane. On the other hand, the surface of the lightning diverter element can be exposed to influences there that lead to the occurrence of the triboelectric effect. Components connected with the antenna, for example high-frequency components, can furthermore be particularly sensitive to a lightning current or to high voltages that are applied to them for an extended period of time and are brought about by electrical discharges caused by the triboelectric effect. Therefore the use of a lightning diverter element at the surface of the antenna can be particularly useful. The surface can particularly be an outer surface of the antenna.

In the case of a lightning diverter element according to the first aspect of the present disclosure, one end of the lightning diverter element can be configured for being connected with a metallic structure. A lightning current can then be discharged from the lightning diverter element to the metallic structure. The metallic structure can be composed to be so heavy that it is able to survive the lightning current without damage. In the case of a vehicle according to the third aspect of the present disclosure, the metallic structure can be part of the vehicle/aircraft/watercraft structure, for example; in the case of an aircraft, the aircraft fuselage, for example, can serve as a structure to which the lightning current is discharged.

The example variants of the present disclosure described above in this specification are also supposed to be disclosed in all combinations with one another. Further example embodiments can be found in the following detailed description of some example embodiments in connection with the figures. The figures merely serve the purpose of clarification of the example embodiments. They are not to scale and are merely supposed to reflect the general concept of the disclosure as examples. For example, characteristics that are contained in the figures should by no means be considered necessary integral parts.

DETAILED DESCRIPTION

Figure 1:
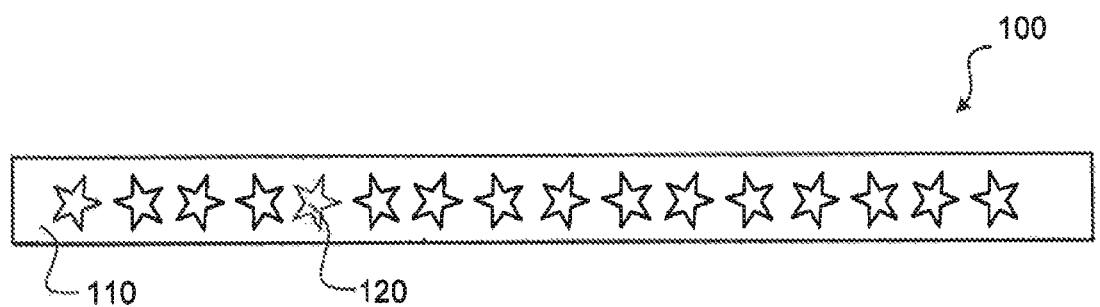
FIG. 1 is a schematic representation of a top view of a first example embodiment of a lightning diverter element according to the first aspect of the present disclosure.

FIG. 1 shows a schematic representation of a top view of a first example embodiment of a lightning diverter element 100 according to the first aspect of the present disclosure.

The segmented lightning diverter element 100 is present as a lightning diverter strip having a length of approximately 30 cm. It comprises a support 110 and metallic segments 120, which are disposed on the support 110. The lightning diverter element 100 is flexible, so that it can be affixed, for example adhesively attached even to domed surfaces. The geometry of the metallic segments 120 can be selected in any desired manner. In FIG. 1, the metallic segments 120 are therefore represented by stars, which stand for the different possible segment geometries, for example circular, square, rectangular or triangular. Adjacent segments 120 are spaced approximately uniformly apart from one another. The support 110 has a monolithic structure, i.e. it comprises only a single layer. It has a rectangular cross-section. Its thickness amounts to 1 mm and its width lies in the range of the segment width of up to 20 mm, for example at 10 mm. It comprises or consists of an insulating plastic as a basic material, which is doped with graphite as a doping material. The graphite makes up 4 volume percent of the material of the support 110. Because of the graphite doping in the concentration indicated, the support 110 has a resistance per unit length in a range from 100 kΩ/m to 100 MΩ/m; in particular, the resistance per unit length lies in a range from 1 MΩ/m to 100 MΩ/m. The volume resistance of the support 110 is homogeneous over the entire support 110.

In one application situation, one end of the lightning diverter element 100 is free and the other end is connected with a metallic structure. The metallic segments 120 form preferred impact points for lightning strikes. A lightning strike can be discharged to the metallic structure, at least for the most part, by way of an ionized channel that forms above the segments 110. A component to be protected, in contrast, can be shielded by the lightning diverter element 100.

The resistance per length unit of the support 100, in the range of 100 kΩ/m to 100 MΩ/m, permanently allows flow of current between the segments 120. Static charge that collects due to the triboelectric effect can thereby flow away by way of the support 110. In this way, it is prevented that one of the metallic segments 120, on which electric charge has collected due to the triboelectric effect, discharges by way of the other metallic segments 120, and spark formation is avoided. Such discharges could lead to a high voltage applied to a component to be protected, over an extended period of time, of up to several 100 V, which damages this component. The resistance per length unit in the range of 100 kΩ/m to 100 MΩ/m allows controlled electrostatic discharge and, at the same time, prevents flow of a lightning current by way of the support 110. The homogeneity of the volume resistance over the entire support 110 also contributes to preventing lightning current from flowing by way of the support, because there are no regions having clearly increased conductivity as compared with other support regions. The conductivity of the support 110 can furthermore make it possible that charge from a surface of a component composed of electrically insulating material, on which surface the support 110 is affixed, can flow away by way of the support. Additional measures for allowing static charge to flow away from the surface can consequently be unnecessary.

Figure 2A:
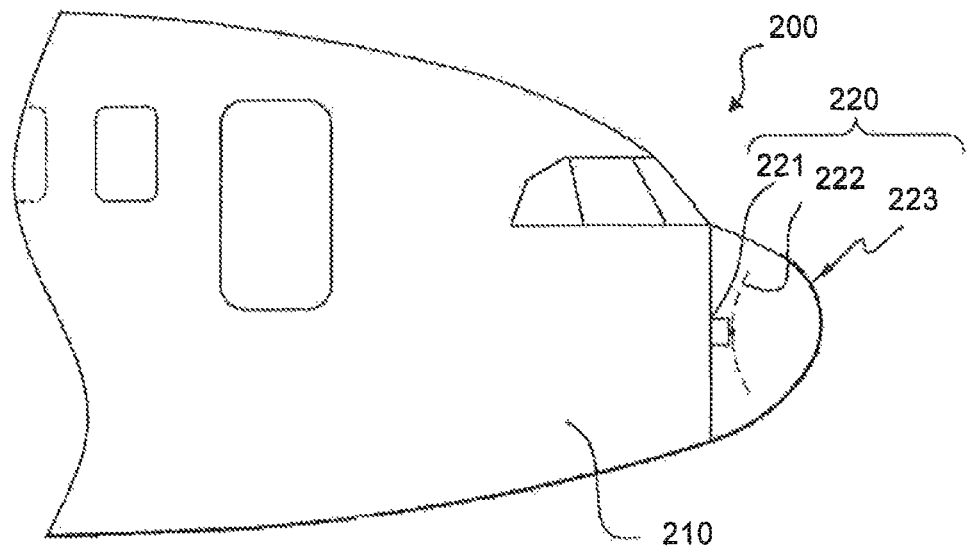
FIG. 2a is a schematic representation of an airplane as an example embodiment of a vehicle according to the third aspect of the present disclosure, wherein the aircraft comprises an example embodiment of a high-frequency device according to the second aspect, which has multiple lightning diverter elements according to the example embodiment from FIG. 1.

FIG. 2a shows a schematic representation of an airplane 200 as an example embodiment of a vehicle according to the third aspect of the present disclosure, wherein the aircraft 200 comprises an example embodiment of a high-frequency device 220 according to the second aspect, which has multiple lightning diverter elements 100 according to the example embodiment from FIG. 1.

The airplane 200 possesses a metallic fuselage 210. Furthermore, it is equipped with a radar device 220. The radar device 220 is disposed at the front end of the airplane 200. It comprises a transmission and reception unit 221, which is connected with the antenna 222 by way of connection means (not shown), which include a coaxial cable and plug. A radome 223 in the form of a paraboloid, comprising or composed of an electrically insulating glass fiber composite material, which is penetrable for electromagnetic radiation so that the radar device 220 can function, serves as a sheath of the radar device 220.

Figure 2B:
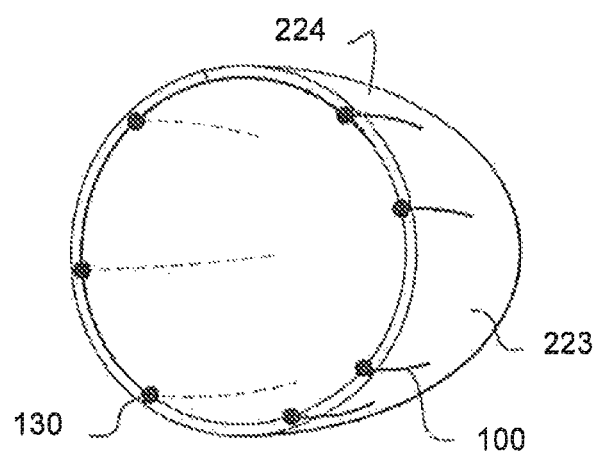
FIG. 2b is a schematic representation of the radome of the high-frequency device from FIG. 2a, together with lightning diverter elements according to the example embodiment from FIG. 1 disposed on it.

FIG. 2b shows a schematic representation of the radome 223 of the radar device 220 from FIG. 2a, including the lightning diverter elements 100 disposed on it, in accordance with the example embodiment from FIG. 1. As shown in FIG. 2b, multiple lightning diverter elements 100 are disposed distributed over an outer surface 224 of the radome 223, wherein one end of the lightning diverter elements 100 is free, in each instance, and the other end 130 is connected with the fuselage 210. Static charge that occurs at the surface of the lightning diverter elements 100 due to the triboelectric effect, for example due to friction with hydrometeors or aerosols in general, can thereby flow away in controlled manner by way of the support 110, to the fuselage 210. Thereby the radar device 220 is protected against the harmful effects of the triboelectric effect. For example, it is prevented that in the case of a discharge of a segment 120, on which electrical charge has collected due to the triboelectric effect, a high voltage in the antenna 222 occurs by way of the other metallic segments 120, which voltage is then also applied, by way of the connection means, to the transmission and reception unit 221, which is designed for input voltages on the order of a few μV, and damages this unit. In addition to the lightning protection for the antenna 222 and the transmission and reception unit 221, which is implemented by the lightning diverter elements 100, charge can furthermore flow away from the surface 224 of the radome 223 by way of the supports 110 of the lightning diverter elements 100 to the airplane fuselage 210. The radome 223 is therefore free of any anti-static varnish.

Figure 2C:
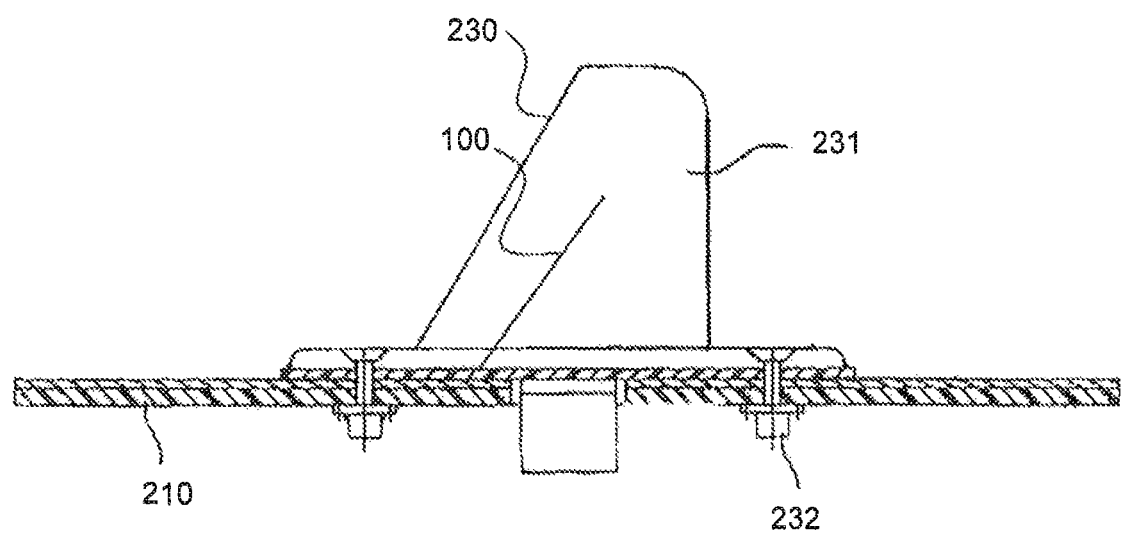
FIG. 2c is a schematic representation of an antenna of the airplane from FIG. 2a, which is part of a further example embodiment of a high-frequency device according to the second aspect of the present disclosure.

FIG. 2c shows a schematic representation of a low-drag antenna 230 of the airplane 200 from FIG. 2a, which antenna is an integral part of a further example embodiment of a high-frequency device according to the second aspect of the present disclosure. The low-drag antenna 230 has a metallic basic body and a weakly conductive or non-conductive outer surface 231, and is connected with the fuselage 210 of the airplane 200 by way of attachment means 232, for example to the airplane fuselage or to a support surface. A lightning diverter element 100 according to the example embodiment from FIG. 1 is disposed on the outer surface 231. Multiple lightning diverter elements 100 can also be provided.

The low-drag antenna 230 represents a preferred impact point for lightning strikes because of its metallic basic body and its placement on the fuselage 210 of the airplane 200, in spite of the non-conductive or only weakly conductive outer surface 231, so that the lightning protection provided by the lightning diverter element 100 is of particular importance. The lightning conductor element 100 can, however, come into contact with hydrometeors, among other things, at its installation position, so that the triboelectric effect occurs at the lightning diverter surface. However, as has already been explained, the resistance per length unit of the support 110 of the lightning diverter element 100 acts to counter its effects. Therefore components connected with the low-drag antenna 230 are protected not only against damage caused by lightning current but also against damage caused by a high voltage applied to them over an extended period of time, due to the triboelectric effect.

The example embodiments described in this specification are also supposed to be disclosed in all combinations with one another. In particular, the description of a characteristic comprised by an embodiment—unless the opposite is explicitly declared—is not to be understood to mean here that the characteristic is absolutely necessary or essential for the function of the example embodiment.

While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A lightning diverter element comprising a support and metallic segments disposed on the support, wherein the support has a resistance per unit length in a range from 100 kΩ/m to 100 MΩ/m;
   wherein the support is doped with an electrically conductive doping material; and
   wherein the doping material comprises between, and including, about 3 to 5 volume percent of a material of the support.

2. The lightning diverter element according to claim 1, wherein the support has a monolithic structure.

3. The lightning diverter element according to claim 1, wherein a base of the support is an insulating material and wherein the electrically conductive doping material is graphite.

4. The lightning diverter element according to claim 1, wherein the doping material comprises 3.5 to 4.5 volume percent, of the material of the support.

5. The lightning diverter element according to claim 1, wherein the support has a homogeneous volume resistance.

6. A high-frequency device, wherein at least one lightning diverter element according to claim 1 is disposed on a surface of a component of the high-frequency device.

7. The high-frequency device according to claim 6, wherein the high-frequency device comprises at least one of: an antenna, a transmission unit, a reception unit, a connection.

8. The high-frequency device according to claim 6, wherein the high-frequency device comprises a sheath that is penetrable for electromagnetic radiation, on a surface of which a lightning diverter element is disposed, wherein optionally, at least one of the following options applies:
   the surface is free of an anti-static varnish; and
   the high-frequency device is a radar device, and the sheath is a radome.

9. The high-frequency device according to claim 7, wherein the high-frequency device comprises an antenna, for example a low-drag antenna having a metallic basic body, which antenna has a surface on which the lightning diverter element is disposed.

10. A vehicle comprising:
   a lightning diverter element comprising a support and metallic segments disposed on the support, wherein the support has a resistance per unit length in a range from 100 kΩ/m to 100 MΩ/m;
   wherein the support is doped with an electrically conductive doping material; and
   wherein the doping material comprises between, and including, about 3 to 5 volume percent of the material of the support.

11. The vehicle according to claim 10 wherein the vehicle is an aircraft.

12. A vehicle comprising:
   a high-frequency device comprising at least one lightning diverter element disposed on a surface of a component of the high-frequency device, the lightning diverter element comprising a support and metallic segments disposed on the support, wherein the support has a resistance per unit length in a range from 100 kΩ/m to 100 MΩ/m;
   wherein the support is doped with an electrically conductive doping material; and
   wherein the doping material comprises between, and including, about 3 to 5 volume percent of the material of the support.

13. The vehicle according to claim 12 wherein the vehicle is an aircraft.

* * * * *